(12) United States Patent
Oruganti et al.

(10) Patent No.: US 11,689,203 B1
(45) Date of Patent: Jun. 27, 2023

(54) METHOD AND APPARATUS FOR SYMMETRIC AGING OF CLOCK TREES

(71) Applicant: QUALCOMM Incorporated, San Diego, CA (US)

(72) Inventors: Kalyan Kumar Oruganti, Vijayawada (IN); Rajesh Arimilli, Bangalore (IN); Sandeep Aggarwal, Bangalore (IN); Gnana Chaitanya Prakash Kopparapu, Markapur (IN); Giby Samson, San Diego, CA (US); Xia Li, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/655,697

(22) Filed: Mar. 21, 2022

(51) Int. Cl.
| H03K 19/17736 | (2020.01) |
| H03K 3/0233 | (2006.01) |
| H03K 3/017 | (2006.01) |
| H03K 19/173 | (2006.01) |

(52) U.S. Cl.
CPC ......... *H03K 19/1774* (2013.01); *H03K 3/017* (2013.01); *H03K 3/0233* (2013.01); *H03K 19/1737* (2013.01)

(58) Field of Classification Search
None
See application file for complete search history.

(56) References Cited

U.S. PATENT DOCUMENTS

| 7,336,116 B2 * | 2/2008 | Hirata .................. G06F 1/10 327/295 |
| 2023/0058318 A1 | 2/2023 | Yallamaraju et al. |

OTHER PUBLICATIONS

L. Lai, V. Chandra, R. Aitken and P. Gupta, "BTI-Gater: An Aging-Resilient Clock Gating Methodology," in IEEE Journal on Emerging and Selected Topics in Circuits and Systems, vol. 4, No. 2, pp. 180-189, Jun. 2014, doi: 10.1109/JETCAS.2014.2315882.

* cited by examiner

Primary Examiner — Jany Richardson
(74) Attorney, Agent, or Firm — Loza & Loza, LLP

(57) ABSTRACT

In certain aspects, an apparatus includes a gating circuit having an enable input, a signal input, and an output, wherein the enable input is configured to receive an enable signal. The apparatus also includes a toggle circuit having an output, wherein the toggle circuit is configured to toggle a logic state at the output of the toggle circuit based on the enable signal. The apparatus further includes a multiplexer having a first input, a second input, and an output, wherein the first input of the multiplexer is coupled to the output of the gating circuit, the second input of the multiplexer is coupled to the output of the toggle circuit. The multiplexer is configured to select one of the first input and the second input based on the enable signal, and couple the selected one of the first input and the second input to the output of the multiplexer.

20 Claims, 13 Drawing Sheets

METHOD AND APPARATUS FOR SYMMETRIC AGING OF CLOCK TREES

BACKGROUND

Field

Aspects of the present disclosure relate generally to aging, and, more particularly, to aging mitigation.

Background

A system may include a clock source (e.g., a phase-locked loop) configured to generate a clock signal for timing operations of one or more circuits (e.g., sequential logic, a processor, a memory, etc.) in the system. The system may also include a clock path for distributing the clock signal from the clock source to the one or more circuits. A challenge facing clock distribution is that asymmetric aging in the clock path can cause duty-cycle distortion in the clock signal, which can lead to timing issues (e.g., timing violations) in the one or more circuits.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus, comprising. The apparatus includes a gating circuit having an enable input, a signal input, and an output, wherein the enable input is configured to receive an enable signal. The apparatus also includes a toggle circuit having an output, wherein the toggle circuit is configured to toggle a logic state at the output of the toggle circuit based on the enable signal. The apparatus further includes a multiplexer having a first input, a second input, and an output, wherein the first input of the multiplexer is coupled to the output of the gating circuit, the second input of the multiplexer is coupled to the output of the toggle circuit. The multiplexer is configured to select one of the first input and the second input based on the enable signal, and couple the selected one of the first input and the second input to the output of the multiplexer.

A second aspect relates to a method of balancing aging in a clock path. The method includes receiving an enable signal, passing a clock signal to the clock path if the enable signal has a first logic state, gating the clock signal if the enable signal has a second logic state, toggling a logic state of a toggle circuit in response to an edge of the enable signal, and passing the logic state of the toggle circuit to the clock path when the clock signal is gated.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
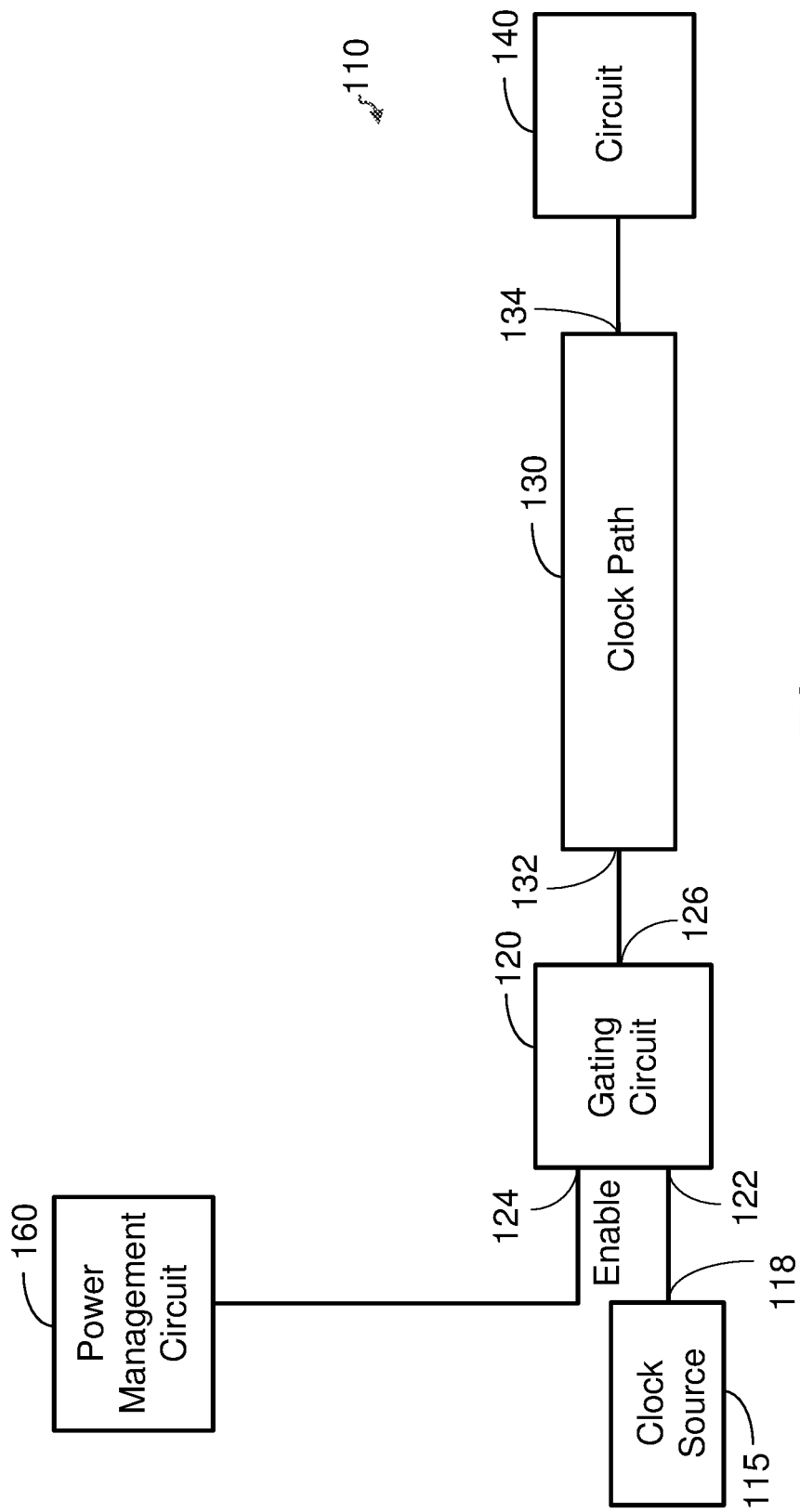
FIG. 1 shows an example of a system including a clock source, a gating circuit, a clock path, and a circuit according to certain aspects of the present disclosure.

FIG. 1 shows an example of a system 110 including a clock source 115, a gating circuit 120, a clock path 130, and a circuit 140 according to certain aspects. The circuit 140 may include sequential logic, a processor, a memory, etc. The clock source 115 is configured to generate a clock signal and output the clock signal at an output 118. The clock source 115 may be implemented with a phase-locked loop (PLL) or another type of clock source. The clock signal is used for timing operations of the circuit 140.

The clock path 130 has an input 132 and an output 134. The output 134 is coupled to the circuit 140. The clock path 130 is configured to receive the clock signal at the input 132 and distribute the clock signal to the circuit 140. As used herein, a "clock signal" may be a periodic signal that oscillates between high and low. The clock signal has a duty cycle, which may be expressed as a percentage or a fraction of a clock period (i.e., clock cycle) in which the clock signal is high (i.e., one).

The gating circuit 120 (also referred to as a clock gating cell) has a signal input 122, an enable input 124, and an output 126. The signal input 122 is coupled to the output 118 of the clock source 115, and the output 126 is coupled to the input 132 of the clock path 130. The enable input 124 is configured to receive an enable signal, and the signal input 122 is configured to receive the clock signal. In operation, the gating circuit 120 is configured to pass the clock signal to the output 126 or gate (i.e., block) the clock signal based on the enable signal. For example, the gating circuit 120 may be configured to pass the clock signal to the output 126 when the enable signal has a first logic state, and gate the clock signal when the enable signal has a second logic state. The first logic state may be high (i.e., one) and the second logic state may be low (i.e., zero), or vice versa. Thus, in this example, when the enable signal transitions from the first logic state to the second logic state, the gating circuit 120 starts gating the clock signal. When the enable signal transitions from the second logic state to the first logic state, the gating circuit 120 stops gating the clock signal.

In certain aspects, the enable signal is provided by a power management circuit 160 coupled to the enable input 124. In these aspects, the power management circuit 160 controls whether the gating circuit 120 passes the clock signal to the clock path 130 or gates (i.e., blocks) the clock signal using the enable signal. In one example, the power management circuit 160 may cause the gating circuit 120 to pass the clock signal using the enable signal (e.g., set the enable signal to the first logic state) when the circuit 140 is active, and cause the gating circuit 120 to gate the clock signal using the enable signal (i.e., set the enable signal to the second logic state) when the circuit 140 is in an idle mode (i.e., not active) to save power. Clock gating is a known technique for reducing dynamic power consumption when a circuit is not active.

Although one gating circuit 120 is shown between the clock source 115 and the clock path 130 in FIG. 1, it is to be appreciated that the system 110 may include two or more clock gating circuits (e.g., at different locations along the clock path 130). It is also to be appreciated that the clock path 130 may include multiple branches (not shown) forming a clock tree to distribute the clock signal to one or more other circuits (not shown) in addition to the circuit 140 shown in FIG. 1.

Aging effects such as bias temperature instability (BTI) can degrade the performance of the clock path 130 over time. For example, BTI stress in the clock path 130 during idle mode can cause a duty-cycle shift in the clock path 130 over time, which can lead to timing issues (e.g., timing violations) in the circuit 140.

Figure 2A:
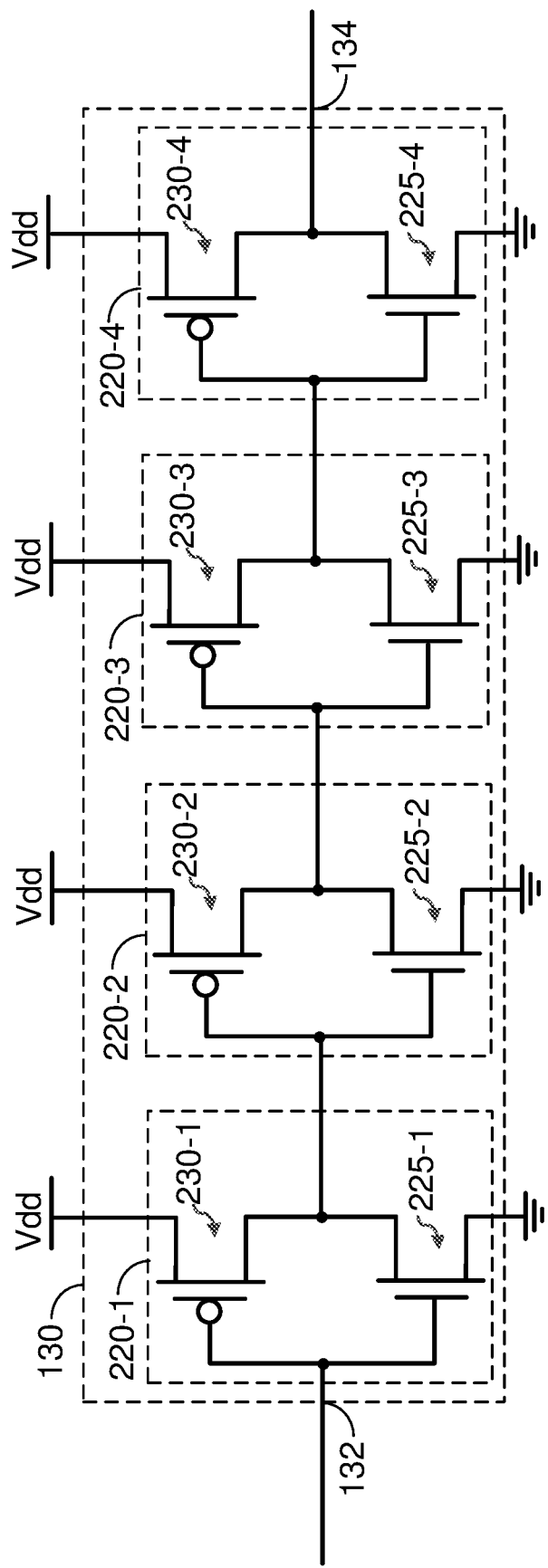
FIG. 2A shows an example of the clock path including clock buffers according to certain aspects of the present disclosure.

An example of duty-cycle shift caused by aging will now be discussed with reference to FIGS. 2A to 2E. FIG. 2A shows an example in which the clock path 130 includes clock buffers 220-1 to 220-4 coupled in series between the input 132 and the output 134. Although four clock buffers 220-1 to 220-4 are shown in FIG. 2A for simplicity, it is to be appreciated that the clock path 130 may include a large number of clock buffers. In the example shown in FIG. 2A, each of the clock buffers 220-1 to 220-4 is implemented with a respective complementary inverter including a respective one of transistors 225-1 to 225-4 (e.g., n-type field effect transistors) and a respective one of transistors 230-1 to 230-4 (e.g., p-type field effect transistors). However, it is to be appreciated that each of the clock buffers 220-1 to 220-4 may be implemented with another type of circuit or logic gate.

When the circuit 140 is in an active mode, the gating circuit 120 passes the clock signal to the input 132 of the clock path 130 and the clock signal propagates through the clock buffers 220-1 to 220-4 to the circuit 140. When the circuit 140 is in an idle mode, the gating circuit 120 gates the clock signal and parks (i.e., holds) the input 132 of the clock path 130 high or low.

Figure 2B:
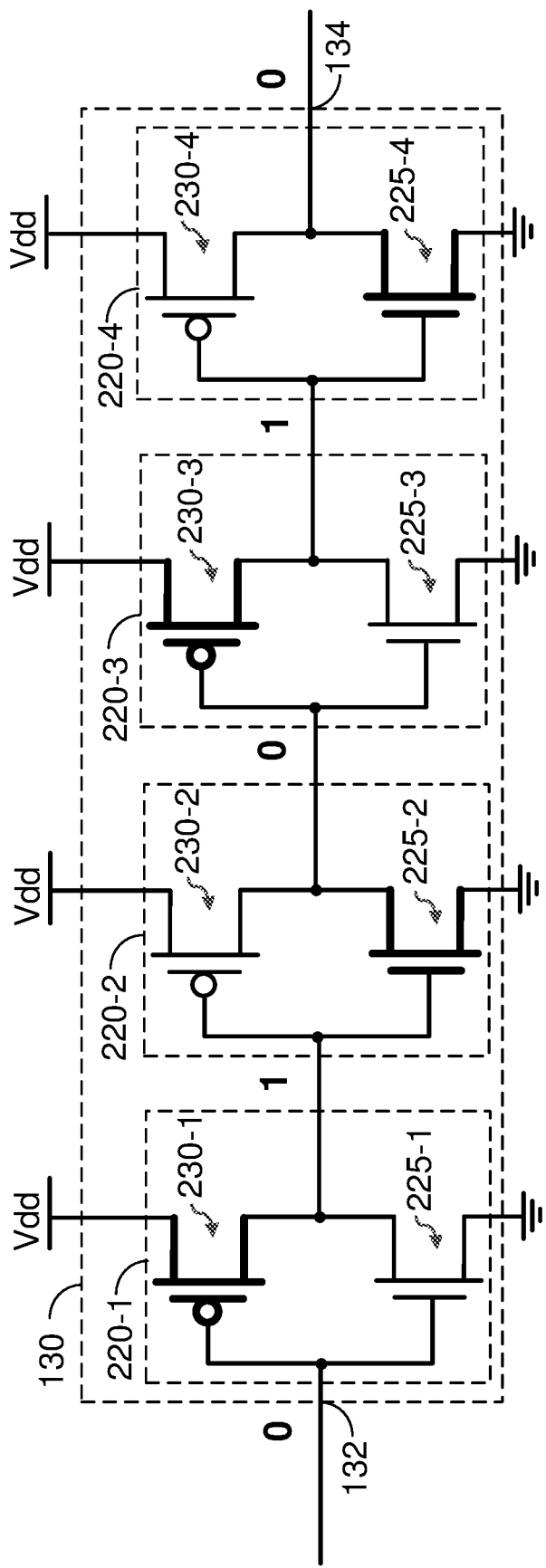
FIG. 2B shows an example in which an input of the clock path is parked low in an idle mode according to certain aspects of the present disclosure.

FIG. 2B shows an example in which the gating circuit 120 parks the input 132 of the clock path 130 low (i.e., logic zero) in the idle mode. FIG. 2B also shows the logic states at the input and the output of each of the clock buffers 220-1 to 220-4. In this example, the output 134 of the clock path 130 is low (i.e., logic zero) in the idle mode. In this example, transistors 230-1, 225-2, 230-3, and 225-4 are turned on in the idle mode and transistors 225-1, 230-2, 225-3, and 230-4 are turned off in the idle mode. In FIG. 2B, the transistors 230-1, 225-2, 230-3, and 225-4 that are turned on in the idle mode are shown with thickened lines. The transistors 230-1, 225-2, 230-3, and 225-4 that are turned on in the idle mode are stressed in the idle mode while the transistors 225-1, 230-2, 225-3, and 230-4 that are turned off in the idle mode are not stressed in the idle mode. This leads to asymmetric aging in which the transistors 230-1, 225-2, 230-3, and 225-4 that are stressed in the idle mode age faster than the transistors 225-1, 230-2, 225-3, and 230-4 that are not stressed in the idle mode.

Figure 2C:
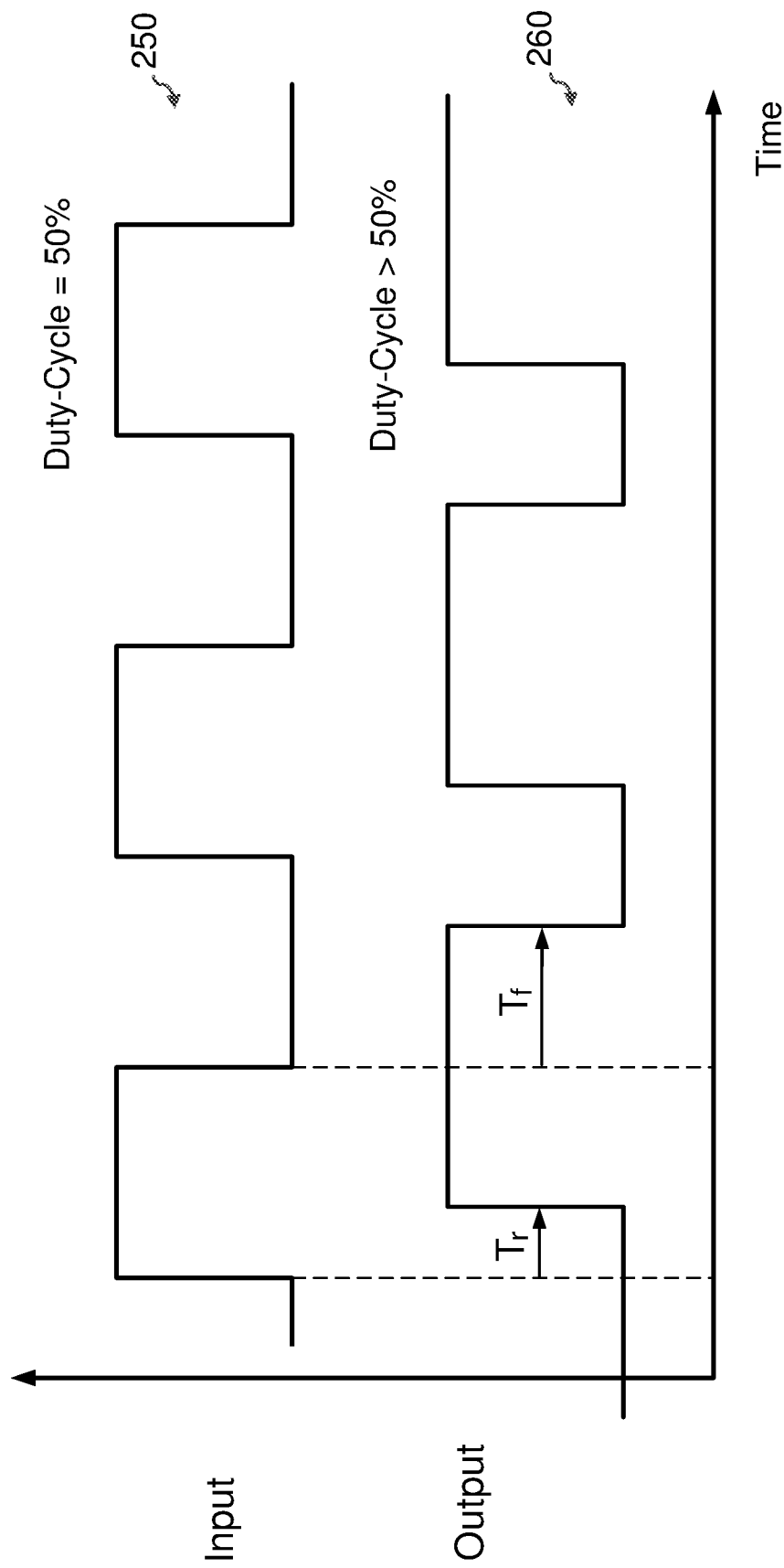
FIG. 2C is a timing diagram illustrating an example of a duty-cycle shift in the clock path due to asymmetric aging according to certain aspects of the present disclosure.

In this example, the asymmetric aging shifts the threshold voltages of the transistors 230-1, 225-2, 230-3, and 225-4 that are stressed in the idle mode, causing the falling edge delay at the output 134 of the clock path 130 to increase relative to the rising edge delay at the output 134 of the clock path 130. The increase in the falling edge delay relative to the rising edge delay causes a duty-cycle shift in the clock path 130. An example of the duty-cycle shift is illustrated in a timing diagram shown in FIG. 2C. In the example shown in FIG. 2C, a clock signal 250 having a duty cycle of 50% is input to the clock path 130 in the active mode. FIG. 2C also shows the clock signal 260 at the output 134 of the clock path 130 after propagating through the clock path 130. The clock path 130 delays a rising edge of the clock signal 250 by delay $T_r$ and delays a falling edge of the clock signal 250 by delay $T_f$. As shown in FIG. 2C, the delay $T_f$ of the falling edge is longer than the delay $T_r$ of the rising edge due to the asymmetric aging. In this example, the longer delay of the falling edge causes the duty cycle of the clock signal 260 at the output 134 of the clock path 130 to increase (i.e., results in a duty cycle greater than 50%).

Figure 2D:
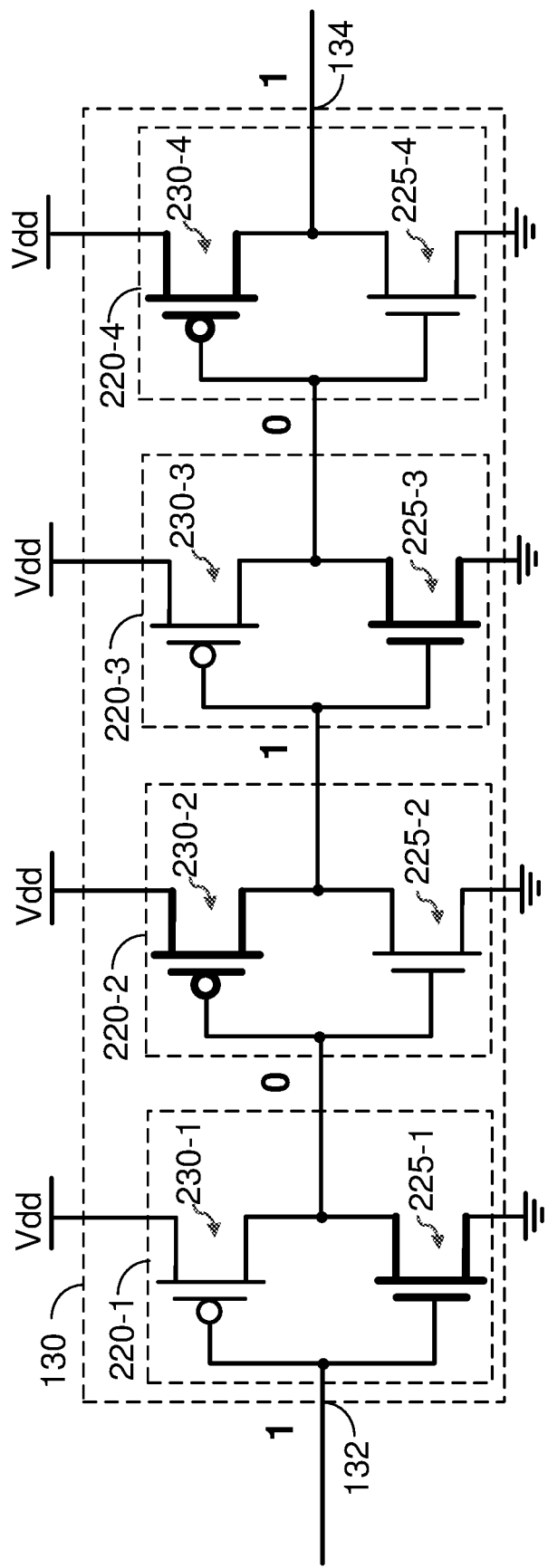
FIG. 2D shows an example in which the input of the clock path is parked high in the idle mode according to certain aspects of the present disclosure.

In the example illustrated in FIGS. 2B and 2C, the gating circuit 120 parks the input 132 of the clock path 130 low in the idle mode. Asymmetric aging also occurs for the case where the gating circuit 120 parks the input 132 of the clock path 130 high in the idle mode. In this regard, FIG. 2D shows an example in which the gating circuit 120 parks the input 132 of the clock path 130 high (i.e., logic one) in the idle mode. FIG. 2D also shows the logic states at the input and the output of each the clock buffers 220-1 to 220-4. In this example, the output 134 of the clock path 130 is high (i.e., logic one) in the idle mode. In this example, transistors 225-1, 230-2, 225-3, and 230-4 are turned on in the idle mode and transistors 230-1, 225-2, 230-3, and 225-4 are turned off in the idle mode. In FIG. 2D, the transistors 225-1, 230-2, 225-3, and 230-4 that are turned on in the idle mode are shown with thickened lines. The transistors 225-1, 230-2, 225-3, and 230-4 that are turned on in the idle mode are stressed in the idle mode while the transistors 230-1, 225-2, 230-3, and 225-4 that are turned off in the idle mode are not stressed in the idle mode, which leads to asymmetric aging in which the transistors 225-1, 230-2, 225-3, and 230-4 that are stressed in the idle mode age faster than the transistors 230-1, 225-2, 230-3, and 225-4.

Figure 2E:
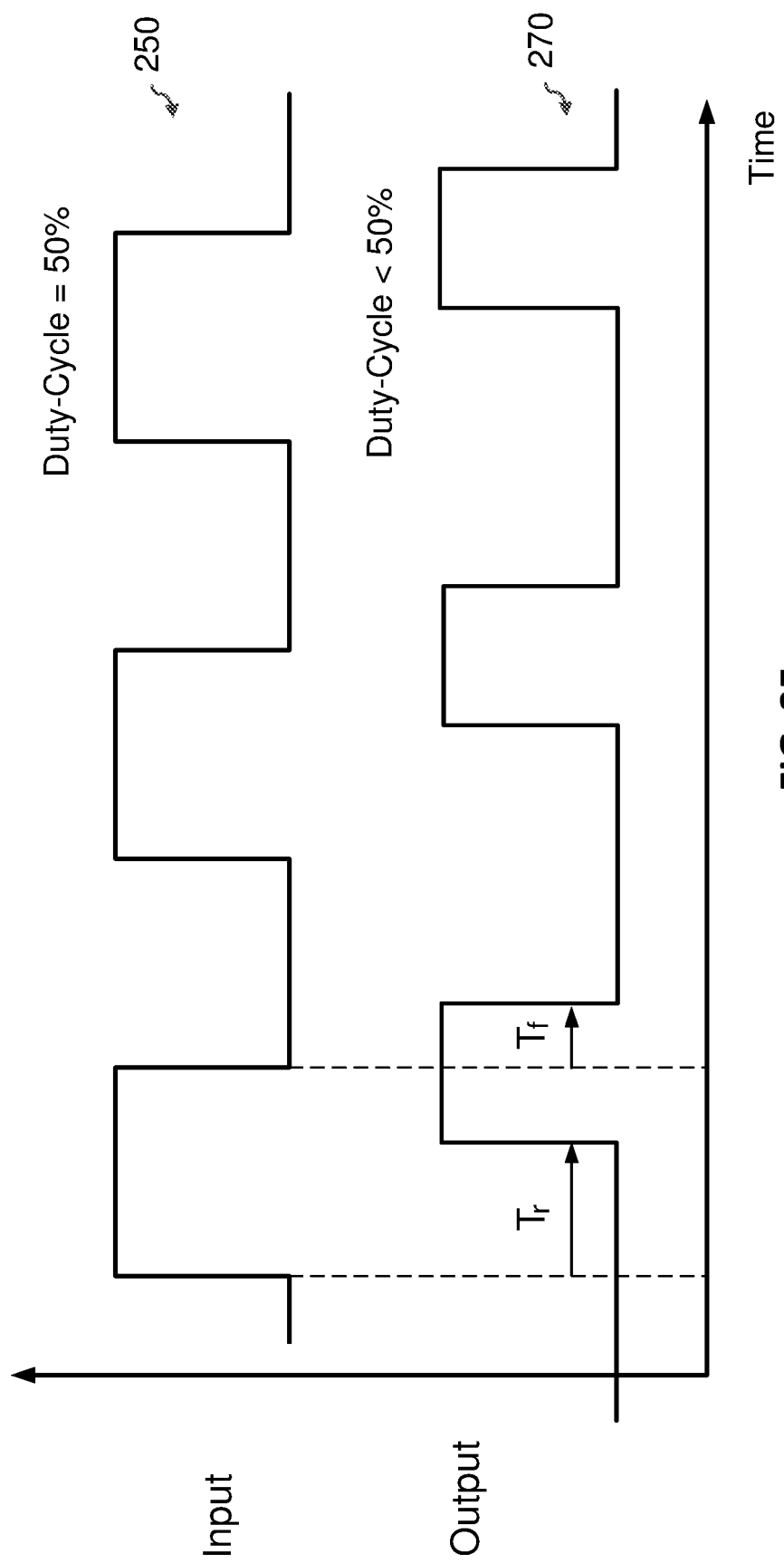
FIG. 2E is a timing diagram illustrating another example of a duty-cycle shift in the clock path due to asymmetric aging according to certain aspects of the present disclosure.

In this example, the asymmetric aging shifts the threshold voltages of the transistors 225-1, 230-2, 225-3, and 230-4 that are stressed in the idle mode, causing the rising edge delay at the output 134 of the clock path 130 to increase relative to the falling edge delay at the output 134 of the clock path 130. The increase in the rising edge delay relative to the falling edge delay causes a duty-cycle shift in the clock path 130. An example of the duty-cycle shift is illustrated in the timing diagram shown in FIG. 2E. In the example shown in FIG. 2E, the clock signal 250 having the duty cycle of 50% is input to the clock path 130 in the active mode. FIG. 2E also shows the clock signal 270 at the output 134 of the clock path 130 after propagating through the clock path 130. The clock path 130 delays a rising edge of the clock signal 250 by delay $T_r$ and delays a falling edge of the clock signal 250 by delay $T_f$ at the output 134 of the clock path 130. As shown in FIG. 2E, the delay $T_r$ of the rising edge is longer than the delay $T_f$ of the falling edge due to the asymmetric aging. In this example, the longer delay of the rising edge causes the duty cycle of the clock signal 270 at the output 134 of the clock path 130 to decrease (i.e., results in a duty cycle less than 50%).

Thus, asymmetric aging in the idle mode causes a duty-cycle shift (i.e., duty-cycle distortion) in the clock path 130 over time. The duty-cycle shift increases or decreases the duty cycle of the clock signal depending, for example, on whether the gating circuit 120 parks the input 132 of the clock path 130 low or high in the idle mode, and the number of clock buffers 220-1 to 220-4 in the clock path 130. The duty-cycle shift can lead to timing issues in the circuit 140. For the example where the circuit 140 includes sequential logic (e.g., flops), the duty-cycle shift can result in setup time and/or hold time violations.

To address duty-cycle shift (i.e., distortion) due to asymmetric aging, aspects of the present disclosure provide a toggle circuit that alternately parks the input of a clock path low and high in the idle mode instead of parking the input of the clock path at the same logic state in the idle mode. By alternately parking the input of the clock path low and high, the toggle circuit helps balance aging of transistors in the clock path to reduce duty-cycle distortion, as discussed further below.

Figure 3:
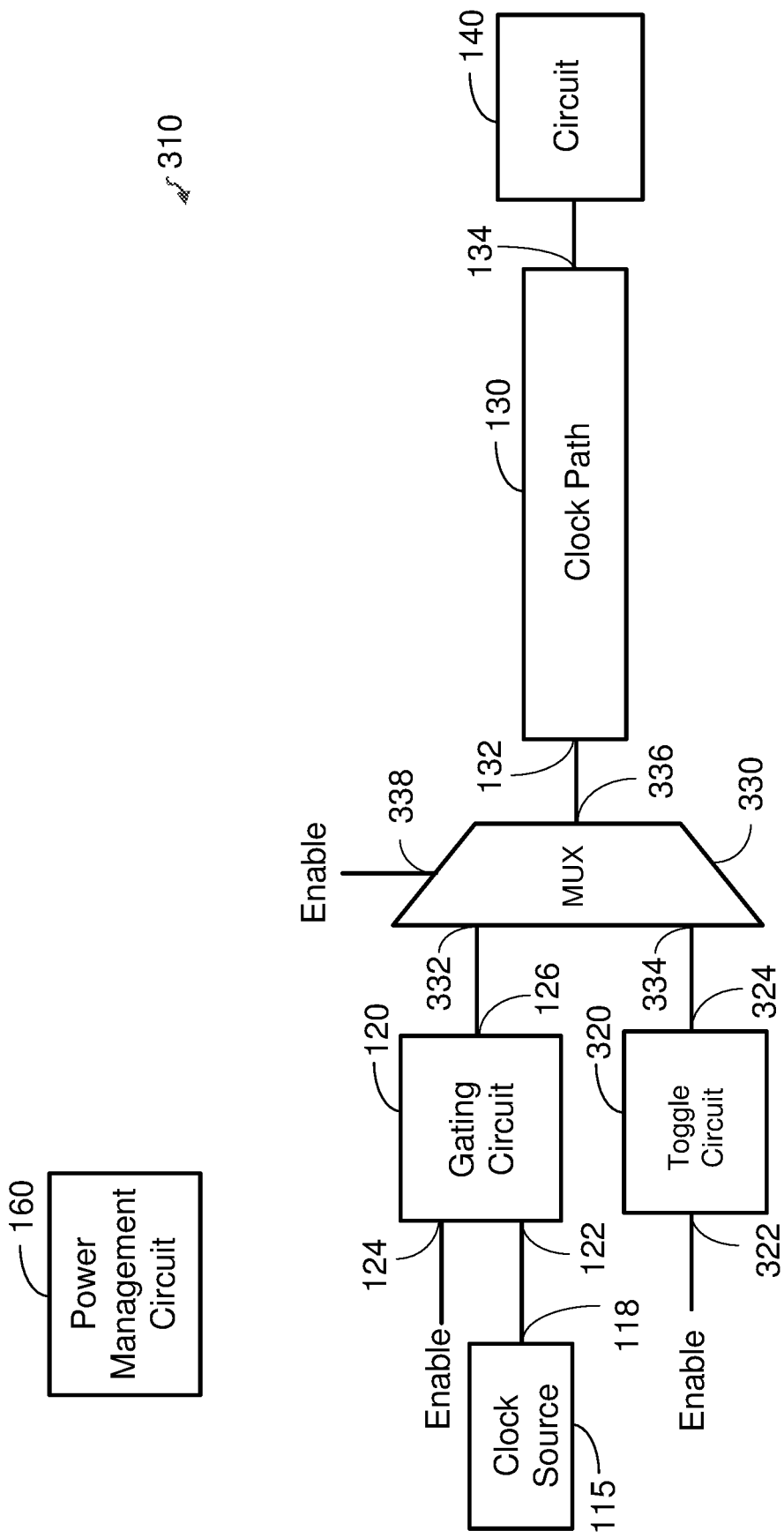
FIG. 3 shows an example of a system including a toggle circuit and a multiplexer according to certain aspects of the present disclosure.

FIG. 3 shows an example of a system 310 including the clock source 115, the gating circuit 120, the clock path 130, and the circuit 140 discussed above. The system 310 also includes a toggle circuit 320 and a multiplexer 330 to help balance aging in the clock path 130 according to certain aspects, as discussed further below.

In this example, the toggle circuit 320 has an input 322 and an output 324. The toggle circuit 320 is configured to receive the enable signal at the input 322, and toggle (i.e., change) the logic state at the output 324 in response to an edge of the enable signal. Thus, if the present logic state at the output 324 is one (i.e., high), then the toggle circuit 320 changes the logic state at the output 324 to zero (i.e., low) on the edge of the enable signal. If the present logic state at the output 324 is zero, then the toggle circuit 320 changes the logic state at the output 324 to one on the edge of the enable signal. In one example, the toggle circuit 320 is positive-edge triggered in which the toggle circuit 320 toggles the logic state at the output 324 on a rising edge of the enable signal. In another example, the toggle circuit 320 is negative-edge triggered in which the toggle circuit 320 toggles the logic state at the output 324 on a falling edge of the enable signal. The toggle circuit 320 may be implemented with a toggle flop or another types of toggle circuit. As discussed further below, the toggle circuit 320 is used to alternately park the input 132 of the clock path 130 low and high in the idle mode to balance aging in the clock path 130.

The multiplexer 330 has a first input 332, a second input 334, an output 336, and a select input 338. The first input 332 is coupled to the output 126 of the gating circuit 120, the second input 334 is coupled to the output 324 of the toggle circuit 320, and the output 336 is coupled to the input 132 of the clock path 130. In certain aspects, the multiplexer 330 is configured to receive the enable signal at the select input 338, select one of the first input 332 and the second input 334 based on the enable signal, and couple the selected one of the first input 332 and the second input 334 to the output 336.

In one example, the multiplexer 330 is configured to select the first input 332 when the enable signal has the first logic state, and select the second input 334 when the enable signal has the second state. As discussed above, the gating circuit 120 is configured to pass the clock signal when the enable signal has the first logic state and gate the clock signal when the enable signal has the second logic state. Thus, in this example, the multiplexer 330 couples the output 126 of the gating circuit 120 to the input 132 of the clock path 130 when the gating circuit 120 passes the clock signal. In this case, the multiplexer 330 passes the clock signal from the gating circuit 120 to the clock path 130. Also, in this example, the multiplexer 330 couples the output 324 of the toggle circuit 320 to the input 132 of the clock path 130 when the gating circuit 120 gates the clock signal in the idle mode. As a result, the output 324 of the toggle circuit 320 controls whether the input 132 of the clock path 130 is parked low or high in the idle mode.

Exemplary operations of the system 310 will now be described according to certain aspects.

In this example, the power management circuit 160 causes the gating circuit 120 to gate the clock signal when the circuit 140 is in the idle mode (i.e., not active) to conserve power. To do this, the power management circuit 160 sets the enable signal to the second logic state in the idle mode, which causes the gating circuit 120 to gate the clock signal and the multiplexer 330 to select the second input 334. Since the multiplexer 330 selects the second input 334 in the idle mode, the output 324 of the toggle circuit 320 is coupled to the input 132 of the clock path 130 in the idle mode and therefore determines whether the input 132 of the clock path 130 is parked low or high in the idle mode.

Over time, the power management circuit 160 causes the gating circuit 120 to gate the clock signal over many idle periods, in which each "idle period" is a period of time during which the circuit 140 is in the idle mode (i.e., not active). The idle periods are separated by active periods, in which each "active period" is a period of time during which the circuit 140 is active. During each active period, the power management circuit 160 causes the gating circuit 120 to pass the clock signal and the multiplexer 330 to select the first input 332 (e.g., by setting the enable signal to the first logic state).

For each idle period, the enable signal has a rising edge and a falling edge. This is because the enable signal transitions from the first logic state to the second logic state at the start of the idle period to gate the clock signal, and transitions from the second logic state to the first logic state at the end of the idle period to un-gate the clock signal. For the example where the first logic state is one and the second logic state is zero, the gating circuit 120 starts gating the clock signal at the start of the idle period on a falling edge of the enable signal, and stops gating the clock signal at the end of the idle period on a rising edge of the enable signal. For the example where the first logic state is zero and the second logic state is one, the gating circuit 120 starts gating the clock signal at the start of the idle period on a rising edge of the enable signal, and stops gating the clock signal at the end of the idle period on a falling edge of the enable signal. Thus, in both examples, the enable signal has both a rising edge and a falling edge for each idle period.

Since the enable signal has both a rising edge and a falling edge for each idle period, the toggle circuit 320 toggles the logic state at the output 324 once for each idle period regardless of whether the toggle circuit 320 is positive-edge triggered or negative-edge triggered. The toggling for each idle period causes the output 324 of the toggle circuit 320 to alternate between low (i.e., zero) and high (i.e., one) over multiple idle periods. Thus, if the output 324 of the toggle circuit 320 is one during a current idle period, then the output 324 is zero during the next idle period, and vice versa.

Since the output 324 of the toggle circuit 320 alternates between low and high over multiple idle periods and the multiplexer 330 couples the output 324 of the toggle circuit 320 to the input 132 of the clock path 130 in the idle mode, the output 324 of the toggle circuit 320 alternatively parks the input 132 of the clock path 130 low and high over the multiple idle periods. Thus, if the input 132 of the clock path 130 is parked low during a current idle period, then the input 132 of the clock path 130 is parked high during the next idle period, and vice versa.

Assuming the accumulative duration of the idle periods in which the input 132 of the clock path 130 is parked low is approximately equal to the accumulative duration of the idle periods in which the input 132 of the clock path 130 is parked high, the input 132 of the clock path 130 spends an approximately equal amount of time parked low and parked high in the idle mode. As a result, the aging of the transistors (e.g., transistors 225-1 to 225-4 and 230-1 to 230-4) in the clock path 130 is approximately balanced (i.e., symmetric). The balanced (i.e., symmetric) aging reduces duty-cycle distortion compared to the case where the input 132 of the clock path 130 is parked at the same logic state for every idle period, which causes asymmetric aging of the transistors in the clock path 130.

Figure 4A:
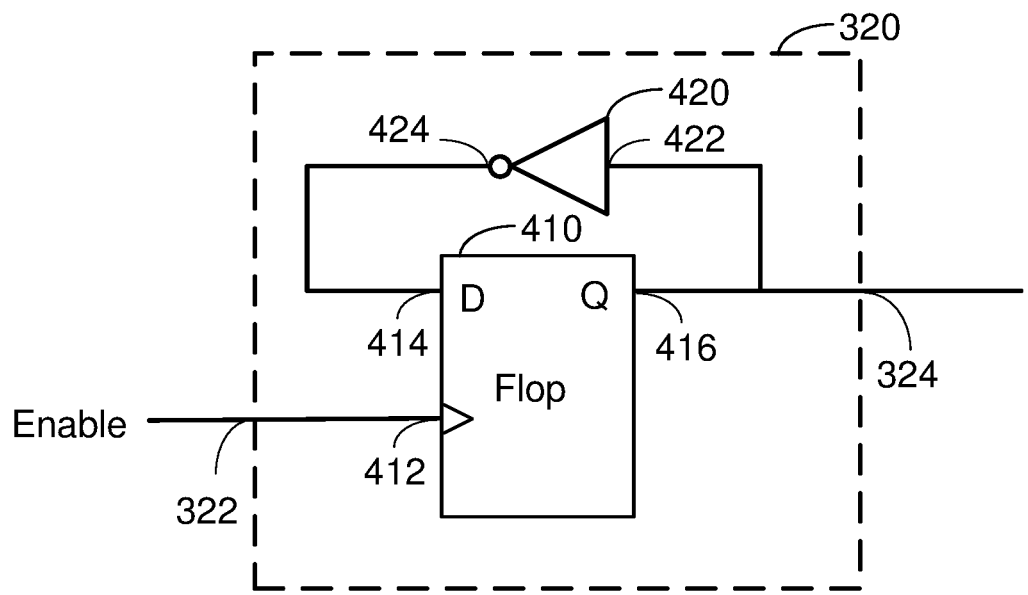
FIG. 4A shows an exemplary implementation of a toggle circuit according to certain aspects of the present disclosure.

FIG. 4A shows an exemplary implementation of the toggle circuit 320 according to certain aspects. In this example, the toggle circuit 320 includes a flop 410 (e.g., a D flip-flop) and an inverter 420. The flop 410 has a clock input 412, a data input 414, and an output 416. The clock input 412 is coupled to the input 322 of the toggle circuit 320 to receive the enable signal, and the output 416 is coupled to the output 324 of the toggle circuit 320. The inverter 420 has an input 422 and an output 424. The input 422 of the inverter 420 is coupled to the output 416 of the flop 410 and the output 424 of the inverter 420 coupled to the data input 414 of the flop 410. Thus, the inverter 420 inverts the logic state at the output 416 of the flop 410 and inputs the inverted logic state at the data input 414 of the flop 410.

In one example, the flop 410 is positive-edge triggered, in which the flop 410 is configured to latch the logic state at the data input 414 on a rising edge of the enable signal, and output the latched logic state at the output 416. In this example, the inverter 420 between the output 416 of the flop 410 and the data input 414 of the flop 410 causes the logic state at the output 416 of the flop 410 (and hence the output 324 of the toggle circuit 320) to toggle on a rising edge of the enable signal.

In another example, the flop 410 is negative-edge triggered, in which the flop 410 is configured to latch the logic state at the data input 414 on a falling edge of the enable signal, and output the latched logic state at the output 416. In this example, the inverter 420 between the output 416 of the flop 410 and the data input 414 of the flop 410 causes the logic state at the output 416 of the flop 410 (and hence the output 324 of the toggle circuit 320) to toggle on a falling edge of the enable signal.

Figure 4B:
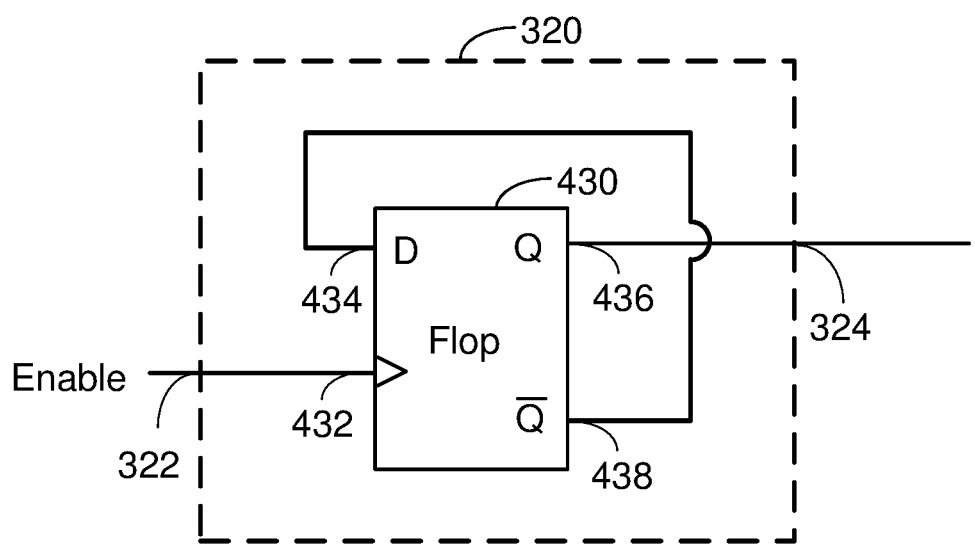
FIG. 4B shows another exemplary implementation of a toggle circuit according to certain aspects of the present disclosure.

FIG. 4B shows another exemplary implementation of the toggle circuit 320 according to certain aspects. In this example, the toggle circuit 320 includes a flop 430 (e.g., a D flip-flop) having a clock input 432, a data input 434, a first output 436, and a second output 438. The first output 436 and the second output 438 are complementary (i.e., the logic state at the second output 438 is the inverse of the logic state at the first output 436). In this example, the clock input 432 is coupled to the input 322 of the toggle circuit 320 to receive the enable signal, and the first output 436 is coupled to the output 324 of the toggle circuit 320. The second output 438 of the flop 430 is coupled to the data input 434 of the flop 430.

In one example, the flop 430 is positive-edge triggered, in which the flop 430 is configured to latch the logic state at the data input 434 on a rising edge of the enable signal, output the latched logic state at the first output 436, and output the inverse of the latched logic state at the second output 438. In this example, coupling the data input 434 to the second output 438 causes the logic state at the first output 436 of the flop 430 (and hence the output 324 of the toggle circuit 320) to toggle on a rising edge of the enable signal.

In another example, the flop 430 is negative-edge triggered, in which the flop 430 is configured to latch the logic state at the data input 434 on a falling edge of the enable signal, output the latched logic state at the first output 436, and output the inverse of the latched logic state at the second output 438. In this example, coupling the data input 434 to the second output 438 causes the logic state at the first output 436 of the flop 430 (and hence the output 324 of the toggle circuit 320) to toggle on a falling edge of the enable signal.

It is to be appreciated that the toggle circuit 320 is not limited to the exemplary implementations shown in FIGS. 4A and 4B, and that the toggle circuit 320 may be implemented using other types of toggle circuits.

Figure 5:
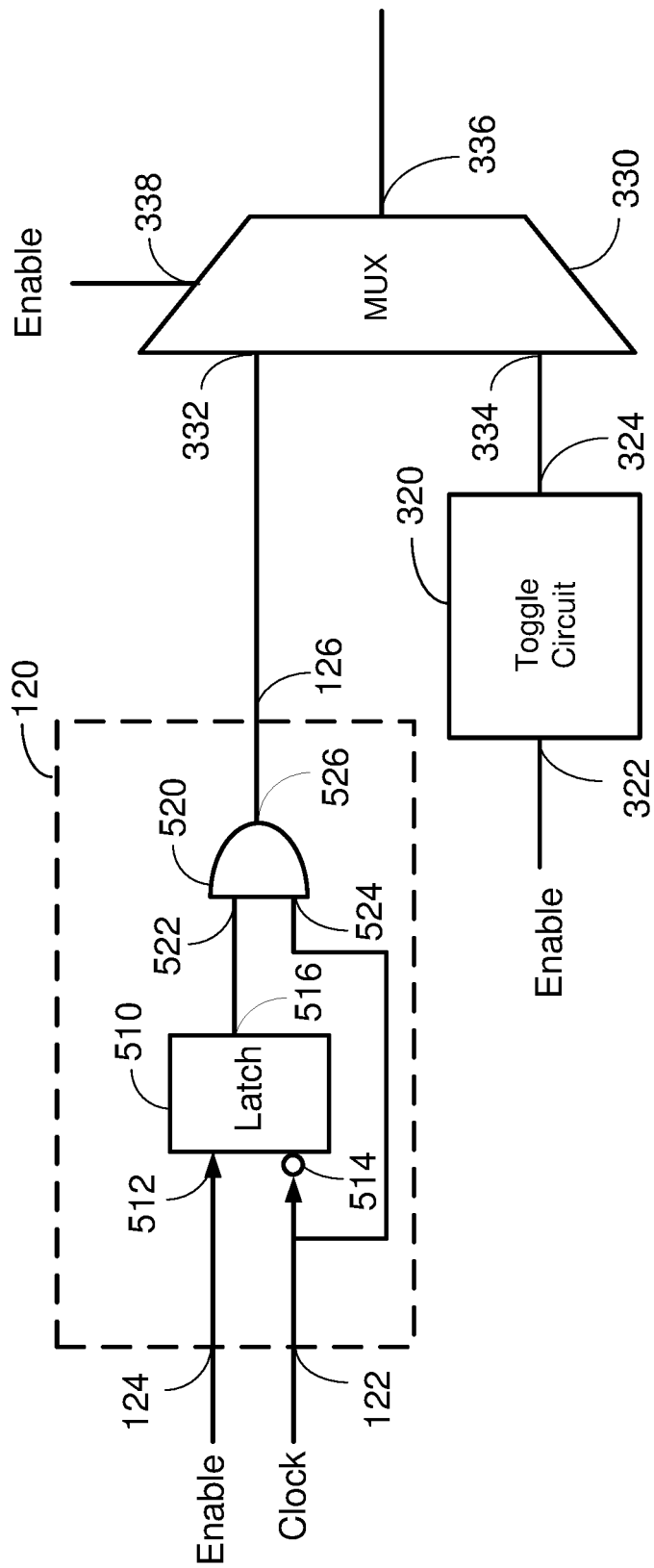
FIG. 5 shows an exemplary implementation of a gating circuit according to certain aspects of the present disclosure.

FIG. 5 shows an exemplary implementation of the gating circuit 120 according to certain aspects. In this example, the gating circuit 120 includes a latch 510 and a gate 520. The latch 510 has a first input 512, a second input 514, and an output 516. The first input 512 is coupled to the enable input 124 of the gating circuit 120 to receive the enable signal, and the second input 514 is coupled to the signal input 122 of the gating circuit 120 to receive the clock signal. In certain aspects, the latch 510 is configured to latch the logic state of the enable signal on a falling edge of the clock signal, and output the latched logic state of the enable signal at the output 516. In these aspects, the latch 510 may be implemented with a negative-edge triggered flop or another type of latch.

The gate 520 has a first input 522, a second input 524, and an output 526. The first input 522 is coupled to the output 516 of the latch 510, the second input 524 is coupled to the signal input 122 of the gating circuit 120 to receive the clock signal, and the output 526 is coupled to the output of the 126 of the gating circuit 120. In the example in FIG. 5, the gate 520 includes an AND gate, which may be implemented with a NAND gate and an inverter. However, it is to be appreciated that the gate 520 is not limited to this example.

In this example, the first logic state of the enable signal discussed above is one and the second logic state of the enable signal discussed above is zero. When the enable signal is one, the latch 510 latches the one on a falling edge of the clock signal and outputs the one to the first input 522 of the gate 520. The one at the first input 522 of the gate 520 causes the gate 520 to pass the clock signal at the second input 524 to the output 526 (and hence the output 126 of the gating circuit 120). Thus, in this example, the gating circuit 120 passes the clock signal when the enable signal is one.

When the enable signal is zero, the latch 510 latches the zero on a falling edge of the clock signal and outputs the zero to the first input 522 of the gate 520. The zero at the first input 522 of the gate 520 causes the gate 520 to output a zero at the output 526 (and hence the output 126 of the gating circuit 120) regardless of the logic state of the clock signal at the second input 524 of the gate 520. This effectively blocks the clock signal at the second input 524 from the output 526, thereby gating the clock signal. Thus, in this example, the gating circuit 120 gates the clock signal when the enable signal is zero. By latching the logic state of the enable signal on a falling edge of the clock signal, the latch 510 helps ensure that the gate 520 starts gating the clock signal when the clock signal is low (i.e., zero) to prevent a glitch at the output 126 of the gating circuit 120

It is to be appreciated that the gating circuit 120 is not limited to the exemplary implementation shown in FIG. 5, and that the gating circuit 120 may be implemented using various arrangements of one or more logic gates and one or more latches.

Figure 6:
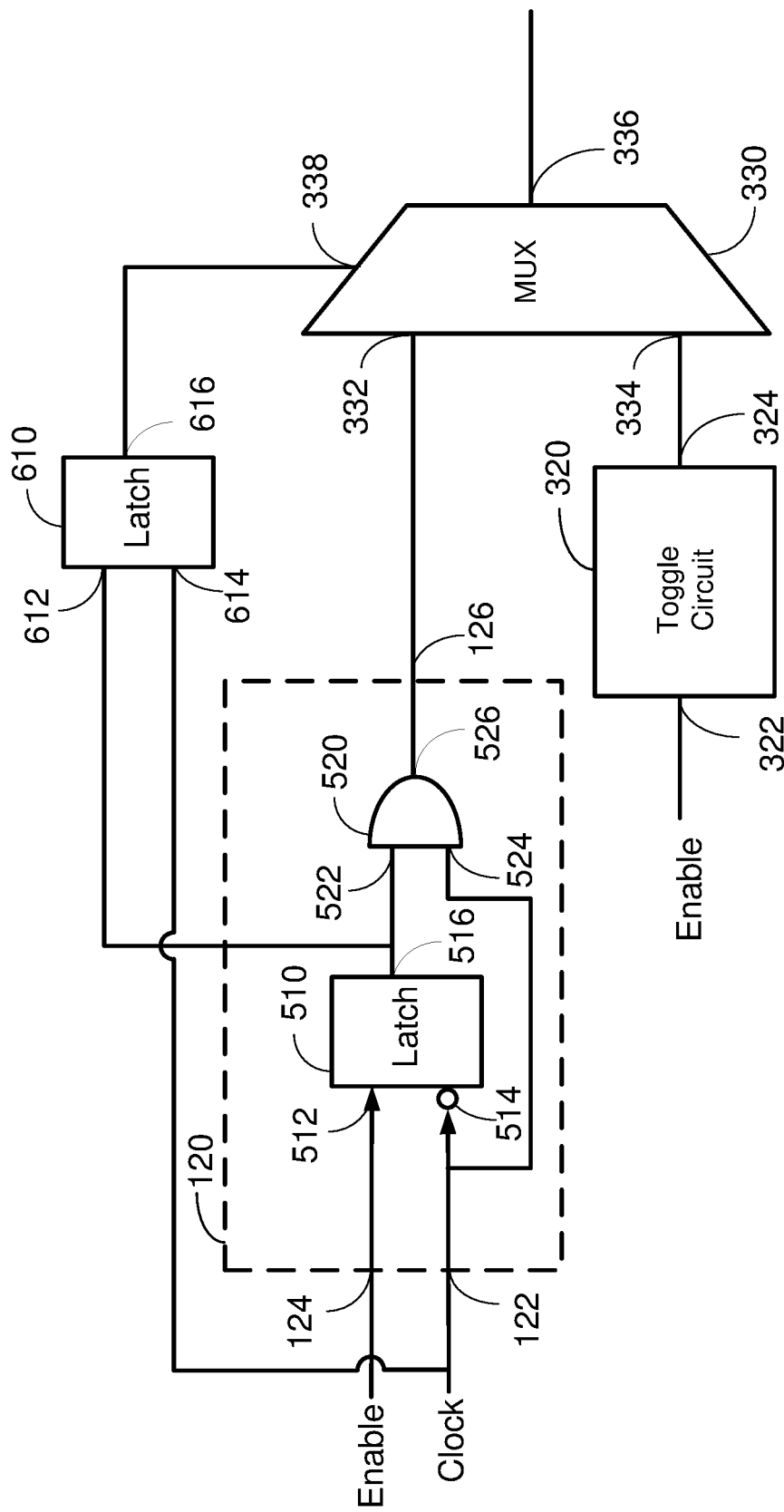
FIG. 6 show an example of a latch between the gating circuit and a select input of the multiplexer according to certain aspects of the present disclosure.

In certain aspects, one or more latches may be used to control the timing of the input of the enable signal to the select input 338 of the multiplexer 330. In this regard, FIG. 6 shows an example of a second latch 610 coupled between the output 516 of the latch 510 in the gating circuit 120 and the select input 338 of the multiplexer 330. In this example, the second latch 610 has a first input 612, a second input 614, and an output 616. The first input 612 is coupled to the output 516 of the latch 510 in the gating circuit 120 and therefore receives the enable signal from the output 516 of the latch 510. The second input 614 is coupled to the clock source 115 (shown in FIG. 3) to receive the clock signal, and the output 616 is coupled to the select input 338 of the multiplexer 330. In certain aspects, the second latch 610 is configured to latch the logic state of the enable signal on a rising edge of the clock signal, and output the latched logic state of the enable signal to the select input 338 of the multiplexer 330 via the output 616. In these aspects, the second latch 610 may be implemented with a positive-edge trigged flop or another type of latch.

In this example, the multiplexer 330 may be configured to select the first input 332 when the enable signal is one and select the second input 334 when the enable signal is zero. Thus, when the gating circuit 120 passes the clock signal in this example, the multiplexer 330 selects the first input 332, and, when the gating circuit 120 gates the clock signal, the multiplexer 330 select the second input 334. As discussed above, the gating circuit 120 in this example starts gating the clock signal when the enable signal transitions from one to zero. In this example, the second latch 610 delays the transition of the enable signal from one to zero by half a period of the clock signal with respect to the output 516 of the latch 510 in the gating circuit 120. As a result, when the gating circuit 120 starts gating the clock signal, the multiplexer 330 switches from the first input 332 to the second input 334 after approximately a half clock period delay. This helps ensure that the multiplexer 330 does not switch from the first input 332 to the second input 334 before the clock signal is gated.

Figure 7:
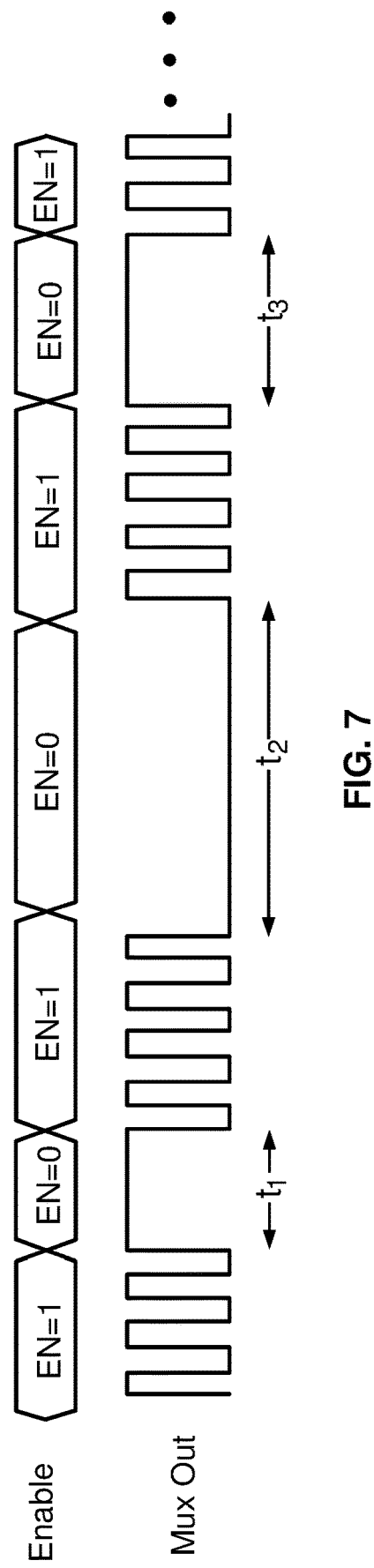
FIG. 7 is a timing diagram showing an example of toggling according to certain aspects of the present disclosure.

FIG. 7 is a timing diagram showing an example of toggling according to certain aspects of the present disclosure. More particularly, FIG. 7 shows an example of the enable signal (labeled "Enable") and the signal at the output 336 of the multiplexer 330 (labeled "Mux Out"). In the example in FIG. 7, the clock signal is un-gated when the enable signal is one and the clock signal is gated when the enable signal is zero. Thus, in this example, the enable signal is zero during the idle periods. As shown in FIG. 7, the output 336 of the multiplexer 330 toggles between one and zero across the idle periods due to the toggling of the toggle circuit 320. In the example in FIG. 7, the output 336 of the multiplexer 330 is one (i.e., high) during odd idle periods (e.g., $t_1, t_3, \ldots$) and zero (i.e., low) during even idle periods (e.g., $t_2, t_4, \ldots$). However, it is to be appreciated that the present disclosure is not limited to this example.

Assuming the accumulative duration of idle periods in which the input 132 of the clock path 130 is zero (i.e., parked low) is approximately equal to the accumulative duration of idle periods in which the input 132 of the clock path 130 is one (i.e., parked high), the input 132 of the clock path 130 spends an approximately equal amount of time parked low and parked high in the idle mode, which balances the aging of the transistors in the clock path 130. The balanced (i.e., symmetric) aging reduces the duty-cycle shift in the clock path 130.

However, in some cases, the accumulative duration of idle periods in which the input 132 of the clock path 130 is zero (i.e., parked low) is not approximately equal to the accumulative duration of idle periods in which the input 132 of the clock path 130 is one (i.e., parked high). This can lead to a duty-cycle shift in the clock path 130 that pushes the duty cycle of the clock signal at the output 134 of the clock path 130 outside an acceptable range. A duty-cycle shift in the clock path 130 may also be caused by environmental conditions and/or other factors.

To address this, the system may include circuitry configured to disable (i.e., override) the toggling in the idle mode when the duty-cycle shift in the clock path 130 pushes the clock signal at the output 134 of the clock path 130 outside an acceptable range. In this case, the circuitry may park the input 132 of the clock path 130 high or low depending on whether the accumulative duration of idle periods in which the input 132 of the clock path 130 is parked low is greater than or less than the accumulative duration of idle periods in which the input 132 of the clock path 130 is parked high. For example, if the duty-cycle shift in the clock path 130 is caused by the accumulative duration of idle periods in which the input 132 of the clock path 130 is parked low being greater than the accumulative duration of idle periods in which the input 132 of the clock path 130 is parked high, then the circuitry may park the input 132 of the clock path 130 high in the idle mode to move the duty-cycle shift in the opposite direction. When the duty cycle of the clock signal moves back within the acceptable range, the circuitry may reenable the toggling in the idle mode.

Figure 8:
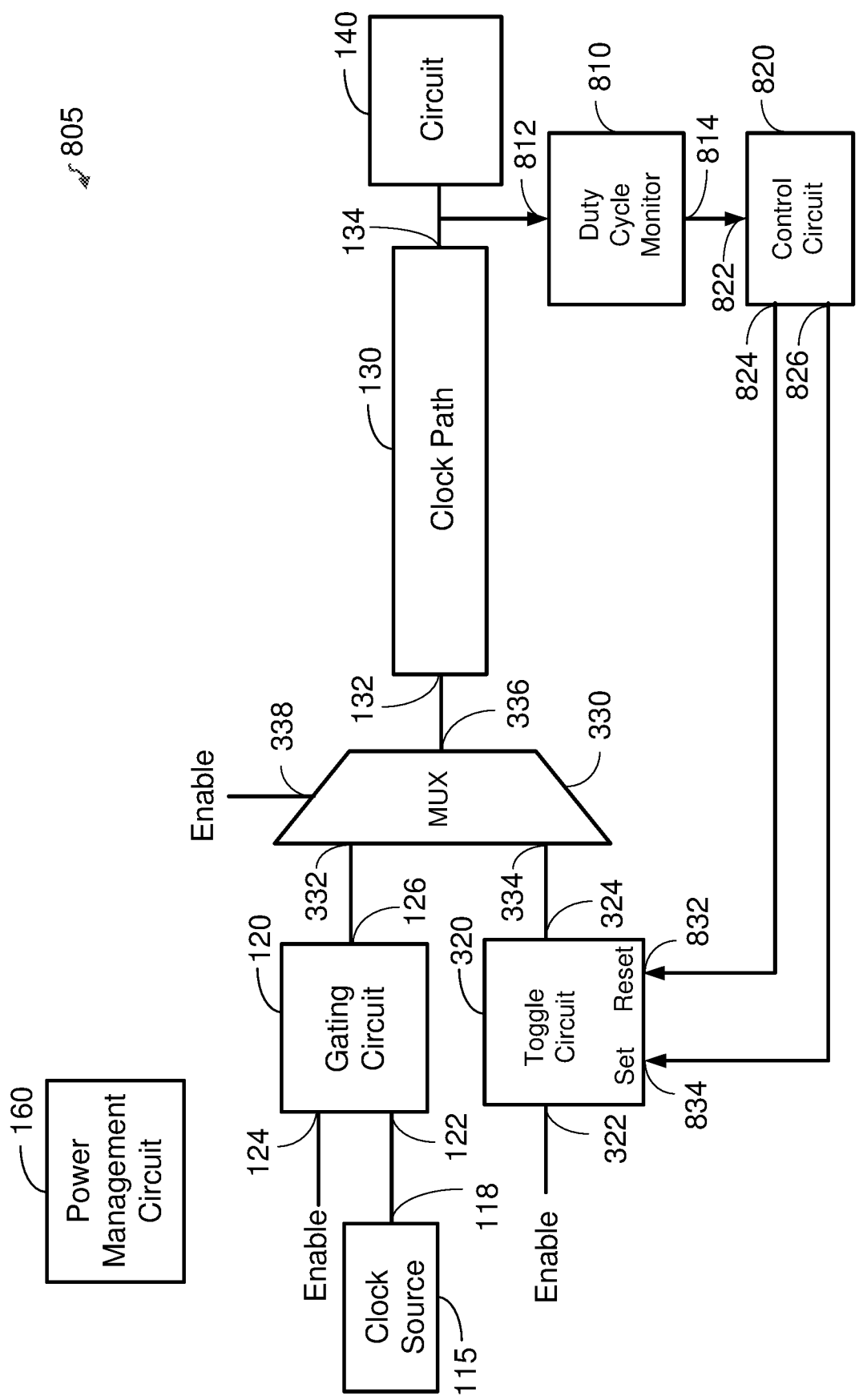
FIG. 8 shows an example of a system including a duty cycle monitor and a control circuit according to certain aspects of the present disclosure.

In this regard, FIG. 8 shows an example of a system 805 including the gating circuit 120, the toggle circuit 320, the multiplexer 330, and the clock path 130 discussed above. The system 805 also includes a duty cycle monitor 810 and a control circuit 820 according to certain aspects. Also, in this example, the toggle circuit 320 also has a reset input 832 and a set input 834.

In one example, the reset input 832 is asserted by inputting a one to the reset input 832 and the set input 834 is asserted by inputting a one to the set input 834. However, it is to be appreciated that the present disclosure is not limited to this example. When the reset input 832 is asserted, the toggle circuit 320 disables (i.e., overrides) toggling and outputs a zero at the output 324. When the set input 834 is asserted, the toggle circuit 320 disables (i.e., overrides) toggling and outputs a one at the output 324. When neither one of the reset input 832 and the set input 834 is asserted, the toggle circuit 320 enables toggling and operates in the manner discussed above with reference to FIG. 3.

The duty cycle monitor 810 has an input 812 and an output 814. The input 812 may be coupled to the output 134 of the clock path 130. In certain aspects, the duty cycle monitor 810 is configured to measure the duty cycle of the clock signal at the output 134 of the clock path 130, and output a measurement signal indicating the measured duty cycle at the output 814. Since the duty cycle monitor 810 is coupled to the output 134 of the clock path 130 in this example, the duty cycle monitor 810 is able to measure a shift in the duty cycle of the clock signal caused by the clock path 130.

The control circuit 820 has an input 822, a first output 824, and a second output 826. The input 822 is coupled to the output of the duty cycle monitor 810, the first output 824 is coupled to the reset input 832 of the toggle circuit 320, and the second output 826 is coupled to the set input 834 of the toggle circuit 320.

In operation, the control circuit 820 receives the measurement signal from the duty cycle monitor 810 via the input 822. The control circuit 820 may then determine whether the measurement signal is within an acceptable range. The acceptable range may correspond to a range of duty cycles that do not result in timing violations in the circuit 140. In one example, the acceptable range may be defined by a first threshold and a second threshold. In this example, the control circuit 820 may determine that the measurement signal is within the acceptable range when the measurement signal is between the first threshold and the second threshold. When the measurement is between the first threshold and the second threshold, the control circuit 820 de-asserts both the reset input 832 and the set input 834 of the toggle circuit 320. In this case, the toggle circuit 320 toggles the output 324 as discussed above with reference to FIG. 3.

In this example, the first threshold may define the upper limit of the acceptable range, in which the duty cycle is considered too high when the measurement signal is above the first threshold. When the measurement signal is above the first threshold, the control circuit 820 asserts one of the reset input 832 and the set input 834. For example, if the measurement signal is above the first threshold when the accumulative duration of idle periods in which the input 132 of the clock path 130 is parked low is greater than the accumulative duration of idle periods in which the input 132 of the clock path 130 is parked high, then the control circuit 820 may park the input 132 of the clock path 130 high by asserting the set input 834. On the other hand, if the measurement signal is above the first threshold when the accumulative duration of idle periods in which the input 132 of the clock path 130 is parked low is less than the accumulative duration of idle periods in which the input 132 of the clock path 130 is parked high, then the control circuit 820 may park the input 132 of the clock path 130 low by asserting the reset input 832. Whether the measurement signal is above the first threshold when the accumulative duration of idle periods in which the input 132 of the clock path 130 is parked low is greater or less than the accumulative duration of idle periods in which the input 132 of the clock path 130 is parked high may depend, for example, on the number of clock buffers in the clock path 130 and/or the implementation of the clock buffers in the clock path 130.

In this example, the second threshold may define the lower limit of the acceptable range, in which the duty cycle of the clock signal is considered too low when the measurement signal is below the second threshold. When the measurement signal is below the second threshold, the control circuit 820 asserts one of the reset input 832 and the set input 834. For example, if the measurement signal is below the second threshold when the accumulative duration of idle periods in which the input 132 of the clock path 130 is parked low is greater than the accumulative duration of idle periods in which the input 132 of the clock path 130 is parked high, then the control circuit 820 may park the input 132 of the clock path 130 high by asserting the set input 834. On the other hand, if the measurement signal is below the second threshold when the accumulative duration of idle periods in which the input 132 of the clock path 130 is parked low is less than the accumulative duration of idle periods in which the input 132 of the clock path 130 is parked high, then the control circuit 820 may park the input 132 of the clock path 130 low by asserting the reset input 832. Whether the measurement signal is below the second threshold when the accumulative duration of idle periods in which the input 132 of the clock path 130 is parked low is greater or less than the accumulative duration of idle periods in which the input 132 of the clock path 130 is parked high may depend, for example, on the number of clock buffers in the clock path 130 and/or the implementation of the clock buffers in the clock path 130.

In this example, the control circuit 820 asserts different ones of the reset input 832 and the set input 834 when the measurement signal is above the first threshold and when the measurement signal is below the second threshold. For example, if the control circuit 820 asserts the reset input 832 when the measurement signal is above the first threshold, then the control circuit 820 asserts the set input 834 when the measurement signal is below the second threshold. On the other hand, if the control circuit 820 asserts the set input 834 when the measurement signal is above the first threshold, then the control circuit 820 asserts the reset input 832 when the measurement signal is below the second threshold.

Figure 9:
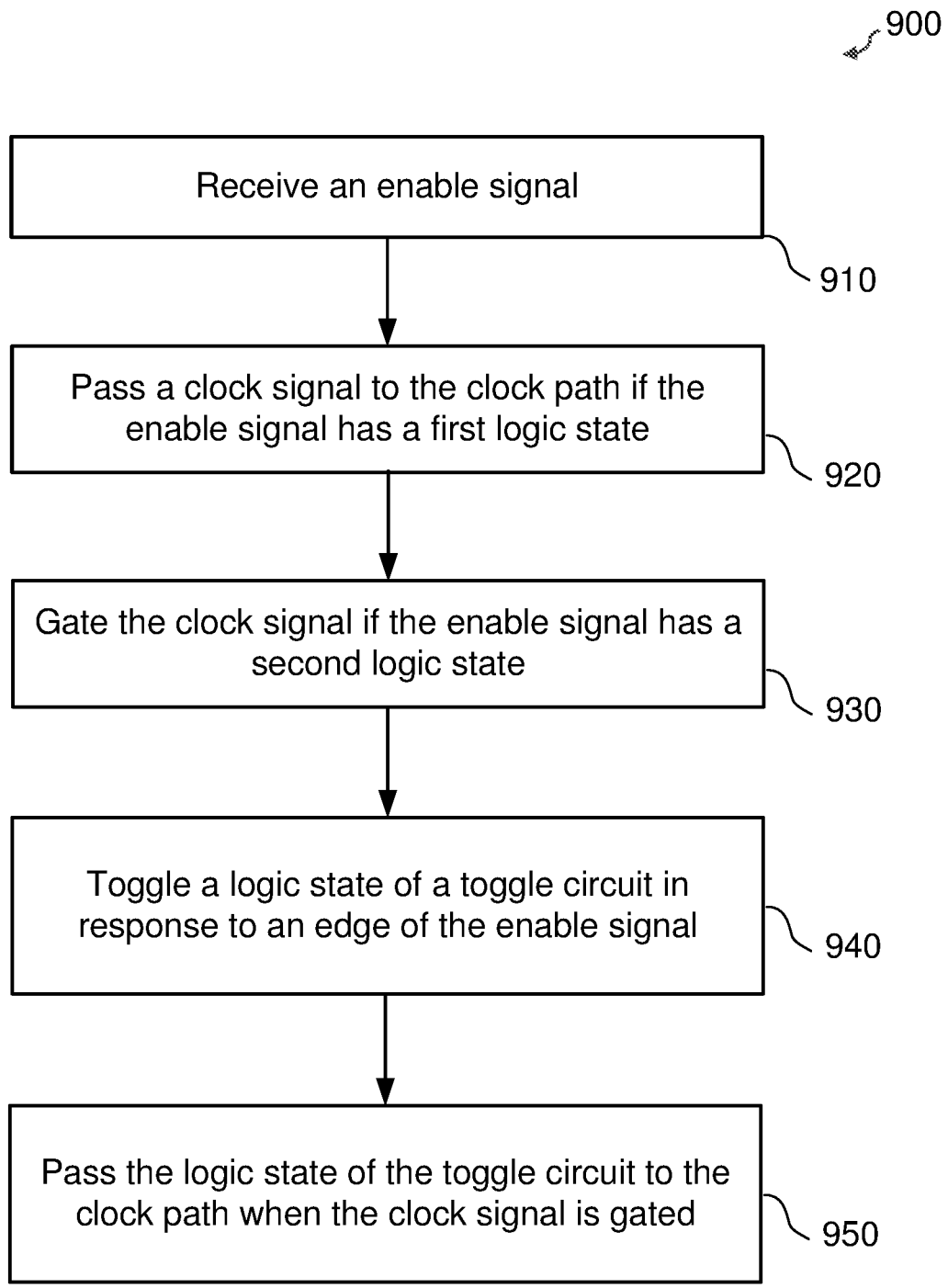
FIG. 9 is a flowchart illustrating a method of balancing aging in a clock path according to certain aspects of the present disclosure.

FIG. 9 illustrates a method 900 of balancing aging in a clock path. The clock path may correspond to the clock path 130.

At block 910, an enable signal is received. For example, the enable signal may be received by the gating circuit 120, the toggle circuit 320, and/or the multiplexer 330.

At block 920, a clock signal is passed to the clock path if the enable signal has a first logic state. The clock signal may be passed by the gating circuit 120 and/or the multiplexer 330.

At block 930, the clock signal is gated if the enable signal has a second logic state. For example, the clock signal may be gated by the gating circuit 120. The first logic state may be one and the second logic state may be zero, or vice versa.

At block 940, a logic state of a toggle circuit is toggled in response to an edge of the enable signal. For example, the logic state of the toggle circuit may be toggled by the toggle circuit 320. The edge of the enable signal may be a rising edge or a falling edge.

At block 950, the logic state of the toggle circuit is passed to the clock path when the clock signal is gated. For example, the logic state of the toggle circuit may be passed to the clock path by the multiplexer 330.

The power management circuit 160 and the control circuit 620 may each be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. An apparatus, comprising:
 a gating circuit having an enable input, a signal input, and an output, wherein the enable input is configured to receive an enable signal;
 a toggle circuit having an output, wherein the toggle circuit is configured to toggle a logic state at the output of the toggle circuit based on the enable signal; and
 a multiplexer having a first input, a second input, and an output, wherein the first input of the multiplexer is coupled to the output of the gating circuit, the second input of the multiplexer is coupled to the output of the toggle circuit, and wherein the multiplexer is configured to:
  select one of the first input and the second input based on the enable signal; and
  couple the selected one of the first input and the second input to the output of the multiplexer.

2. The apparatus of clause 1, wherein the signal input of the gating circuit is coupled to a clock source.

3. The apparatus of clause 2, wherein the output of the multiplexer is coupled to a clock path including clock buffers coupled in series.

4. The apparatus of any one of clauses 1 to 3, wherein the toggle circuit is configured to toggle the logic state at the output of the toggle circuit in response to an edge of the enable signal.

5. The apparatus of any one of clauses 1 to 4, wherein:
 the gating circuit is configured to receive a clock signal at the signal input, pass the clock signal to the output of the gating circuit if the enable signal is high, and gate the clock signal if the enable signal is low; and
 the multiplexer is configured to select the first input if the enable signal is high, and select the second input if the enable signal is low.

6. The apparatus of any one of clauses 1 to 4, wherein:
 the gating circuit is configured to receive a clock signal at the signal input, pass the clock signal to the output of the gating circuit if the enable signal is low, and gate the clock signal if the enable signal is high; and
 the multiplexer is configured to select the first input if the enable signal is low, and select the second input if the enable signal is high.

7. The apparatus of any one of clauses 1 to 6, wherein the toggle circuit comprises:
 a flop having a data input, a clock input, and an output, wherein the clock input of the flop is configured to receive the enable signal, and the output of the flop is coupled to the output of the toggle circuit; and
 an inverter coupled between the output of the flop and the data input of the flop.

8. The apparatus of any one of clauses 1 to 6, wherein the toggle circuit comprises:
 a flop having a data input, a clock input, a first output, and a second output, wherein the clock input of the flop is configured to receive the enable signal, the first output is coupled to the output of the toggle circuit, the second output is coupled to the data input, and the first output and the second output are complementary.

9. The apparatus of any one of clauses 1 to 8, further comprising:
 a clock path coupled to the output of the multiplexer, the clock path including clock buffers coupled in series;
 a duty cycle monitor coupled to the clock path; and
 a control circuit coupled to the duty cycle monitor, and coupled to at least one of a set input and a reset input of the toggle circuit.

10. The apparatus of clause 9, wherein:
 the duty cycle monitor is configured to measure a duty cycle of a clock signal on the clock path, and output a measurement signal indicating the measured duty cycle to the control circuit; and
 the control circuit is configured to assert one of the set input and the reset input of the toggle circuit if the measurement signal is above a threshold.

11. The apparatus of clause 9, wherein:
 the duty cycle monitor is configured to measure a duty cycle of a clock signal on the clock path, and output a measurement signal indicating the measured duty cycle to the control circuit; and
 the control circuit is configured to assert one of the set input and the reset input of the toggle circuit if the measurement signal is below a threshold.

12. The apparatus of clause 9, wherein:
 the duty cycle monitor is configured to measure a duty cycle of a clock signal on the clock path, and output a measurement signal indicating the measured duty cycle to the control circuit; and
 the control circuit is configured to assert the reset input of the toggle circuit if the measurement signal is above a first threshold, and assert the set input of the toggle circuit if the measurement signal is below a second threshold.

13. The apparatus of clause 9, wherein:
 the duty cycle monitor is configured to measure a duty cycle of a clock signal on the clock path, and output a measurement signal indicating the measured duty cycle to the control circuit; and
 the control circuit is configured to assert the set input of the toggle circuit if the measurement signal is above a first threshold, and assert the reset input of the toggle circuit if the measurement signal is below a second threshold.

14. The apparatus of any one of clauses 1 to 13, wherein the gating circuit comprises:
 a latch having a first input, a second input, and an output, wherein the first input of the latch is coupled to the enable input of the gating circuit, and the second input of the latch is coupled to the signal input of the gating circuit; and
 a gate having a first input, a second input, and an output, where the first input of the gate is coupled to the output of the latch, the second input of the latch is coupled to the signal input of the gating circuit, and the output of the gate is coupled to the output of the gating circuit.

15. The apparatus of clause 14, wherein the gate comprises an AND gate.

16. A method of balancing aging in a clock path, comprising:
 receiving an enable signal;
 passing a clock signal to the clock path if the enable signal has a first logic state;

gating the clock signal if the enable signal has a second logic state;

toggling a logic state of a toggle circuit in response to an edge of the enable signal; and passing the logic state of the toggle circuit to the clock path when the clock signal is gated.

17. The method of clause 16, wherein the first logic state is one and the second logic state is zero.

18. The method of clause 16, wherein the first logic state is zero and the second logic state is one.

19. The method of any one of clauses 16 to 18, wherein the edge of the enable signal is a rising edge.

20. The method of any one of clauses 16 to 18, wherein the edge of the enable signal is a falling edge.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a gating circuit having an enable input, a signal input, and an output, wherein the enable input is configured to receive an enable signal;
a toggle circuit having an output, wherein the toggle circuit is configured to toggle a logic state at the output of the toggle circuit based on the enable signal; and
a multiplexer having a first input, a second input, and an output, wherein the first input of the multiplexer is coupled to the output of the gating circuit, the second input of the multiplexer is coupled to the output of the toggle circuit, and wherein the multiplexer is configured to:
select one of the first input and the second input based on the enable signal; and
couple the selected one of the first input and the second input to the output of the multiplexer.

2. The apparatus of claim 1, wherein the signal input of the gating circuit is coupled to a clock source.

3. The apparatus of claim 2, wherein the output of the multiplexer is coupled to a clock path including clock buffers coupled in series.

4. The apparatus of claim 1, wherein the toggle circuit is configured to toggle the logic state at the output of the toggle circuit in response to an edge of the enable signal.

5. The apparatus of claim 1, wherein:
the gating circuit is configured to receive a clock signal at the signal input, pass the clock signal to the output of the gating circuit if the enable signal is high, and gate the clock signal if the enable signal is low; and the multiplexer is configured to select the first input if the enable signal is high, and select the second input if the enable signal is low.

6. The apparatus of claim 1, wherein:
the gating circuit is configured to receive a clock signal at the signal input, pass the clock signal to the output of the gating circuit if the enable signal is low, and gate the clock signal if the enable signal is high; and
the multiplexer is configured to select the first input if the enable signal is low, and select the second input if the enable signal is high.

7. The apparatus of claim 1, wherein the toggle circuit comprises:
a flop having a data input, a clock input, and an output, wherein the clock input of the flop is configured to receive the enable signal, and the output of the flop is coupled to the output of the toggle circuit; and
an inverter coupled between the output of the flop and the data input of the flop.

8. The apparatus of claim 1, wherein the toggle circuit comprises:
a flop having a data input, a clock input, a first output, and a second output, wherein the clock input of the flop is configured to receive the enable signal, the first output is coupled to the output of the toggle circuit, the second output is coupled to the data input, and the first output and the second output are complementary.

9. The apparatus of claim 1, further comprising:
a clock path coupled to the output of the multiplexer, the clock path including clock buffers coupled in series;
a duty cycle monitor coupled to the clock path; and
a control circuit coupled to the duty cycle monitor, and coupled to at least one of a set input and a reset input of the toggle circuit.

10. The apparatus of claim 9, wherein:
the duty cycle monitor is configured to measure a duty cycle of a clock signal on the clock path, and output a measurement signal indicating the measured duty cycle to the control circuit; and
the control circuit is configured to assert one of the set input and the reset input of the toggle circuit if the measurement signal is above a threshold.

11. The apparatus of claim 9, wherein:
the duty cycle monitor is configured to measure a duty cycle of a clock signal on the clock path, and output a measurement signal indicating the measured duty cycle to the control circuit; and
the control circuit is configured to assert one of the set input and the reset input of the toggle circuit if the measurement signal is below a threshold.

12. The apparatus of claim 9, wherein:
the duty cycle monitor is configured to measure a duty cycle of a clock signal on the clock path, and output a measurement signal indicating the measured duty cycle to the control circuit; and
the control circuit is configured to assert the reset input of the toggle circuit if the measurement signal is above a first threshold, and assert the set input of the toggle circuit if the measurement signal is below a second threshold.

13. The apparatus of claim 9, wherein:
the duty cycle monitor is configured to measure a duty cycle of a clock signal on the clock path, and output a measurement signal indicating the measured duty cycle to the control circuit; and
the control circuit is configured to assert the set input of the toggle circuit if the measurement signal is above a first threshold, and assert the reset input of the toggle circuit if the measurement signal is below a second threshold.

14. The apparatus of claim 1, wherein the gating circuit comprises:
- a latch having a first input, a second input, and an output, wherein the first input of the latch is coupled to the enable input of the gating circuit, and the second input of the latch is coupled to the signal input of the gating circuit; and
- a gate having a first input, a second input, and an output, where the first input of the gate is coupled to the output of the latch, the second input of the latch is coupled to the signal input of the gating circuit, and the output of the gate is coupled to the output of the gating circuit.

15. The apparatus of claim 14, wherein the gate comprises an AND gate.

16. A method of balancing aging in a clock path, comprising:
- receiving an enable signal;
- passing a clock signal to the clock path if the enable signal has a first logic state;
- gating the clock signal if the enable signal has a second logic state;
- toggling a logic state of a toggle circuit in response to an edge of the enable signal; and
- passing the logic state of the toggle circuit to the clock path when the clock signal is gated.

17. The method of claim 16, wherein the first logic state is one and the second logic state is zero.

18. The method of claim 16, wherein the first logic state is zero and the second logic state is one.

19. The method of claim 16, wherein the edge of the enable signal is a rising edge.

20. The method of claim 16, wherein the edge of the enable signal is a falling edge.

* * * * *